(12) United States Patent
Ouyang et al.

(10) Patent No.: US 11,515,382 B2
(45) Date of Patent: Nov. 29, 2022

(54) FLEXIBLE DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Qi Ouyang, Wuhan (CN); Mugyeom Kim, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 211 days.

(21) Appl. No.: 16/956,547

(22) PCT Filed: Apr. 10, 2020

(86) PCT No.: PCT/CN2020/084185
§ 371 (c)(1),
(2) Date: Jun. 19, 2020

(87) PCT Pub. No.: WO2021/189550
PCT Pub. Date: Sep. 30, 2021

(65) Prior Publication Data
US 2022/0140044 A1 May 5, 2022

(30) Foreign Application Priority Data
Mar. 26, 2020 (CN) .......................... 202010223338.9

(51) Int. Cl.
*H01L 27/32* (2006.01)
*H01L 51/52* (2006.01)

(52) U.S. Cl.
CPC ...... *H01L 27/3276* (2013.01); *H01L 51/5237* (2013.01); *H01L 2251/5338* (2013.01)

(58) Field of Classification Search
CPC ............. H01L 2251/5338; H01L 51/50; H01L 51/0097
See application file for complete search history.

(56) References Cited

U.S. PATENT DOCUMENTS

2018/0033979 A1 2/2018 Jang et al.
2021/0320275 A1* 10/2021 Cho ...................... H01L 51/524

FOREIGN PATENT DOCUMENTS

CN 204377242 U 6/2015
CN 108155219 A 6/2018
(Continued)

OTHER PUBLICATIONS

International Search Report in International application No. PCT/CN2020/084185, dated Dec. 25, 2020.

*Primary Examiner* — Yu-Hsi D Sun
(74) *Attorney, Agent, or Firm* — PV IP PC; Wei Te Chung; Ude Lu (57) ABSTRACT

A flexible display panel and a display device are provided. The flexible display panel includes a non-bending zone and at least one bending zone. A shape of the non-bending zone is a first rectangle, and a shape of the at least one bending zone is a second rectangle. The bending zone is arranged around the non-bending zone and is connected to the non-bending zone. A side of the second rectangle is connected to a straight side of the first rectangle. At least one of two rounded corners corresponding to the straight side of the non-bending zone connected to the at least one bending zone includes a concave wave shape.

11 Claims, 8 Drawing Sheets

(56) References Cited

FOREIGN PATENT DOCUMENTS

| CN | 109686746 A | 4/2019 |
| CN | 110085649 A | 8/2019 |
| CN | 209843113 U | 12/2019 |

\* cited by examiner

FIG. 1

(PRIOR ART)

FLEXIBLE DISPLAY PANEL AND DISPLAY DEVICE

RELATED APPLICATIONS

This application is a Notional Phase of PCT Patent Application No. PCT/CN2020/084185 having international filing date of Apr. 10, 2020, which claims the benefit of priority of Chinese Patent Application No. 202010223338.9 filed on Mar. 26, 2020. The contents of the above applications are all incorporated by reference as if fully set forth herein in their entirety.

FIELD OF DISCLOSURE

The present disclosure relates to the field of display technologies, and more particular to a flexible display panel and a display device.

BACKGROUND

Looking back at a development of smart phones in the past decade, an appearance and functions of the smart phones have undergone earth-shaking changes. In order to gain a stronger market competitiveness, major mobile phone manufacturers are researching and optimizing the smart phones in various ways.

In recent years, full screen display has become one of research hotspots. In order to achieve a better visual experience, a "waterfall screen" design (i.e., a dual curved design, both sides of a screen are curved, and a curvature is the same) has appeared in existing smart phones. Because of its excellent visual performances and ergonomics advantages, it has been sought after and favored by many consumers. Also, in order to further improve a screen-to-body ratio and optimize a display performance, various manufacturers have successively started to develop four-curved mobile phones, that is, a curved screen is curved in four directions, up, down, left, and right. However, the four-curved mobile phone has extremely high requirements on a reliability of a display screen. In a process of screen bending, bent corners are subjected to a lot of stress, which leads to a greater risk of wire breakage of metal wires here, resulting in poor display.

SUMMARY OF DISCLOSURE

The present disclosure provides a flexible display panel and a display device. The flexible display panel can effectively reduce a risk of metal wires breaking due to bent corners are subjected to excessive stress.

To solve the above problem, in a first aspect, the present disclosure provides a flexible display panel including a non-bending zone and at least one bending zone.

A shape of the non-bending zone is a first rectangle with rounded corners at all four corners.

The at least one bending zone is arranged around the non-bending zone and is connected to the non-bending zone. A shape of the at least one bending zone is a second rectangle, and a side of the second rectangle is connected to a straight side of the first rectangle with the rounded corners at all four corners. At least one of two rounded corners corresponding to the straight side of the non-bending zone connected to the at least one bending zone includes a concave wave shape.

In one flexible display panel of an embodiment of the present disclosure, a curved direction of the concave wave shape is toward an inside of the non-bending zone.

In one flexible display panel of an embodiment of the present disclosure, a length of the side of the at least one bending zone connected to the non-bending zone is greater than a length of two sides adjacent to and perpendicular to the side.

In one flexible display panel of an embodiment of the present disclosure, the concave wave shape includes a plurality of crests and a plurality of troughs.

In one flexible display panel of an embodiment of the present disclosure, there are various distances between the plurality of crests and the plurality of troughs of the concave wave shape.

In one flexible display panel of an embodiment of the present disclosure, the flexible display panel includes four bending zones correspondingly connected to four straight sides of the first rectangle with the rounded corners at all four corners of the non-bending zone. At least one of the four corners of the non-bending zone includes the concave wave shape, and a curved direction of the concave wave shape is toward an inside of the non-bending zone.

In one flexible display panel of an embodiment of the present disclosure, all four corners of the non-bending zone include the concave wave shape.

In one flexible display panel of an embodiment of the present disclosure, concave wave shapes of the four corners of the non-bending zone are the same or different from each other.

In one flexible display panel of an embodiment of the present disclosure, the flexible display panel includes a plurality of metal wires disposed at an edge area of the flexible display panel, and at least one of the metal wires is adaptively arranged along the concave wave shape in the edge area.

In one flexible display panel of an embodiment of the present disclosure, the at least one of the metal wires is adaptively arranged along the concave wave shape in the edge area, and remaining metal wires have a reduced width at the concave wave shape in the edge area.

In one flexible display panel of an embodiment of the present disclosure, the flexible display panel includes:
  a substrate;
  an array layer disposed on the substrate;
  an organic light emitting diode (OLED) device layer disposed on the array layer; and
  a thin film encapsulation layer disposed on the OLED device layer.

The array layer includes the plurality of metal wires, and the plurality of metal wires include a reset signal wire and a cathode potential wire.

In another aspect, the present disclosure provides a display device. The display device includes the flexible display panel as mentioned above.

In comparison to the prior art, the present disclosure provides the flexible display panel including the bending zone and the non-bending zone. By designing the corner at a junction of the bending zone and the non-bending zone as an arc corner, a stress caused by bending at this position can be effectively released, thereby reducing a risk of metal wires breaking and improving a yield of the display panel.

BRIEF DESCRIPTION OF DRAWINGS

To describe the technical solutions in the embodiments of the disclosure more clearly, the following briefly introduces the accompanying drawings required for describing the embodiments. Apparently, the accompanying drawings in the following description show merely some embodiments of the disclosure, and a person of ordinary skill in the art may still derive other drawings from these accompanying drawings without creative efforts.

DETAILED DESCRIPTION

The technical solutions in the embodiments of the present disclosure are clearly and completely described herein with reference to the drawings in the embodiments of the present disclosure. Apparently, the described embodiments represent only some and not all of the embodiments of the present disclosure. All other embodiments obtained by one of ordinary skill in the art based on the embodiments of the present disclosure fall within the scope of protection of the present disclosure.

In the description of the present disclosure, it should be understood that orientations or positional relationships indicated by the terms "central", "longitudinal", "lateral", "length", "width", "thickness", "upper", "lower", "front", "rear", "left", "right", "vertical", "horizontal", "top", "bottom", "inner", "outer", etc. are based on those illustrated in the drawings, just for facilitating the descriptions of the present disclosure and simplifying the descriptions, rather than specifying or implying that the concerned devices or elements must have particular orientations, or configured and operated in particular orientations, and hence cannot be understood as limitations to the present disclosure. In addition, terms such as "first" and "second" are used herein for purposes of description and are not intended to indicate or imply relative importance or significance or to imply the number of indicated technical features. Thus, the feature defined with "first" and "second" may include one or more of this feature. In the description of the present disclosure, "a plurality of" means two or more than two, unless specified otherwise.

In the present disclosure, the term "exemplary" is used herein to mean "serving as an example, instance, or illustration." Any embodiment described herein as "exemplary" is not necessarily to be construed as preferred or advantageous over other embodiments. In order to enable any person skilled in the art to implement and use the present disclosure, the following description is given. In the following description, details are listed for explanatory purposes. It should be understood that those of ordinary skill in the art may recognize that the present disclosure can be implemented without using these specific details. In other embodiments, well-known structures and processes will not be elaborated in detail to avoid unnecessary details obscuring the description of the present disclosure. Therefore, the present disclosure is not intended to be limited to the illustrated embodiments, but is consistent with the widest scope consistent with the principles and features disclosed by the present disclosure.

Figure 1:
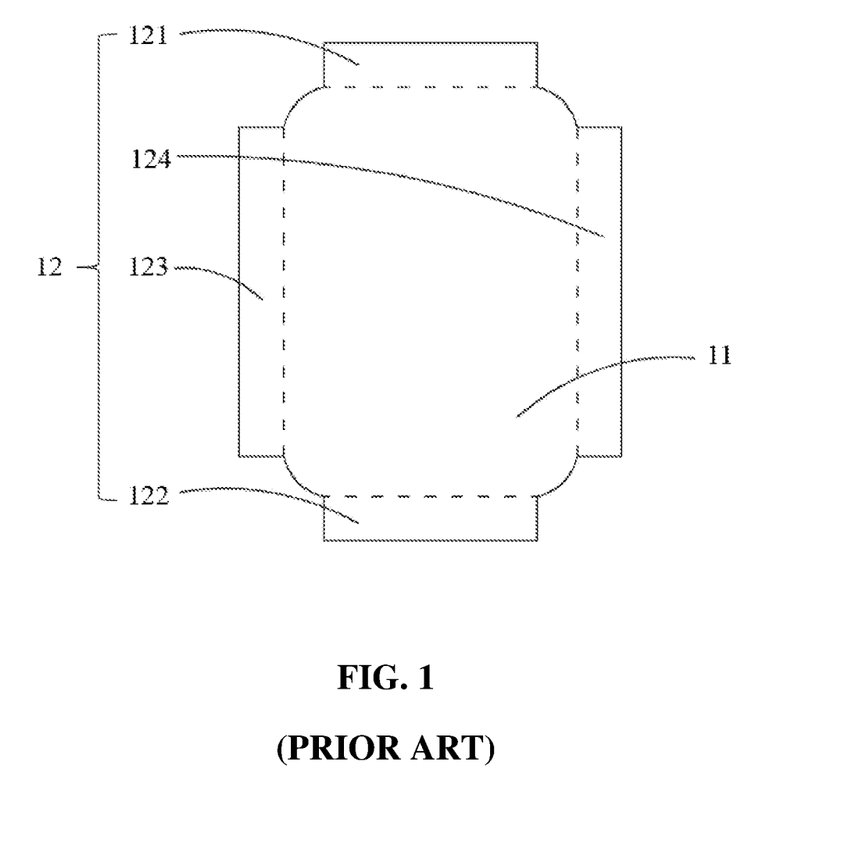
FIG. 1 is a plan view of a flexible display panel in the prior art.

Please refer to FIG. 1, which provides a plan view of an existing four curved display panel which including a non-bending zone 11 and a bending zone 12. The bending zone 12 includes four bending zones 121, 122, 123, 124 connected to upper, lower, left, and right sides of the non-bending zone 11. There is an inward sharp corner at a junction of the non-bending zone 11 and the bending zone 12. During a bending process, a large stress will accumulate, which makes metal wires in this area easy to break and cause poor display.

Figure 2:
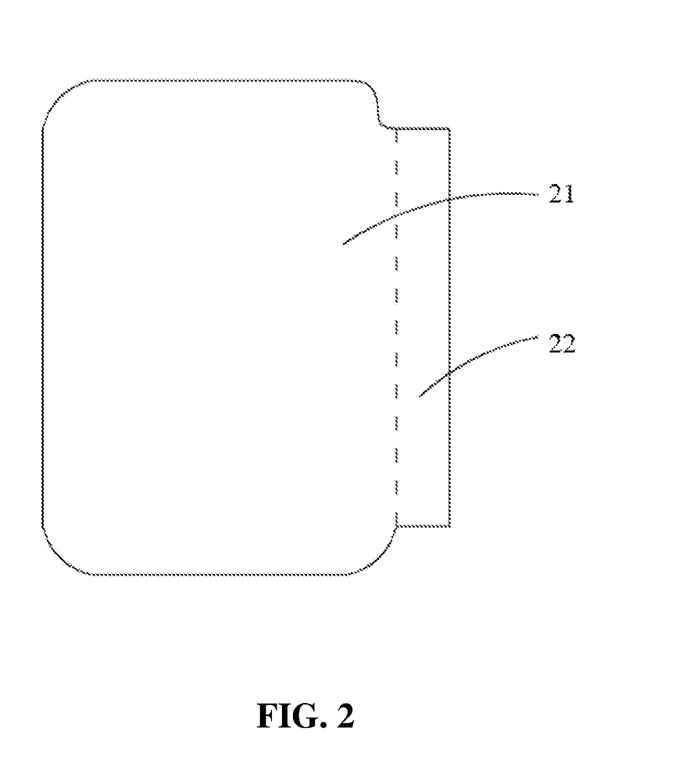
FIG. 2 is a plan view of a flexible display panel of a first embodiment of the present disclosure.

In view of this, an embodiment of the present disclosure provides a flexible display panel, and its plan view is shown in FIG. 2. The flexible display panel includes a non-bending zone 21 and a bending zone 22. A shape of the non-bending zone 21 is a first rectangle with rounded corners at all four corners. The bending zone 22 is disposed and connected to a right side of the non-bending zone. A shape of the bending zone 22 is a second rectangle. A left side of the second rectangle is connected to a right straight side of the first rectangle with the rounded corners at all four corners. At least one of two rounded corners corresponding to the straight side of the non-bending zone 21 connected to the bending zone 22 includes a concave wave shape. The concave wave shape is set at the rounded corner corresponding to the bending zone, which can effectively release a large stress caused by the bending and avoid a risk of metal wires breaking here.

In this embodiment, a curved direction of the concave wave shape is toward an inside of the non-bending zone 21.

In this embodiment, a length of the side of the bending zone 22 connected to the non-bending zone 21 is greater than a length of two sides adjacent to and perpendicular to the side. That is, a long side of the bending zone 22 is connected to the non-bending zone 21.

In another embodiment of the present disclosure provides a flexible display panel. Based on the previous embodiment, the single-curved flexible display panel is modified to a four-curved flexible display panel. Specifically, please refer to FIG. 3, the flexible display panel includes a non-bending zone 21 and a bending zone 22. A shape of the non-bending zone 21 is a first rectangle with rounded corners at all four corners. The bending zone 22 includes bending zones 221, 222, 223, and 224 disposed on upper, lower, left, and right sides of the non-bending zone 21. At least one of the four corners of the non-bending zone 21 includes a concave wave shape. A curved direction of the concave wave shape is toward an inside of the non-bending zone 21. For example, an upper right corner has the concave wave shape. Specifically, the concave wave shape includes two crests (a direction protruding toward the non-bending zone 21 is defined as the crest) and one trough. The two crests are set at the rounded corner corresponding to the bending zone, which can effectively release a large stress caused by the bending and avoid a risk of metal wires breaking here.

Figure 3:
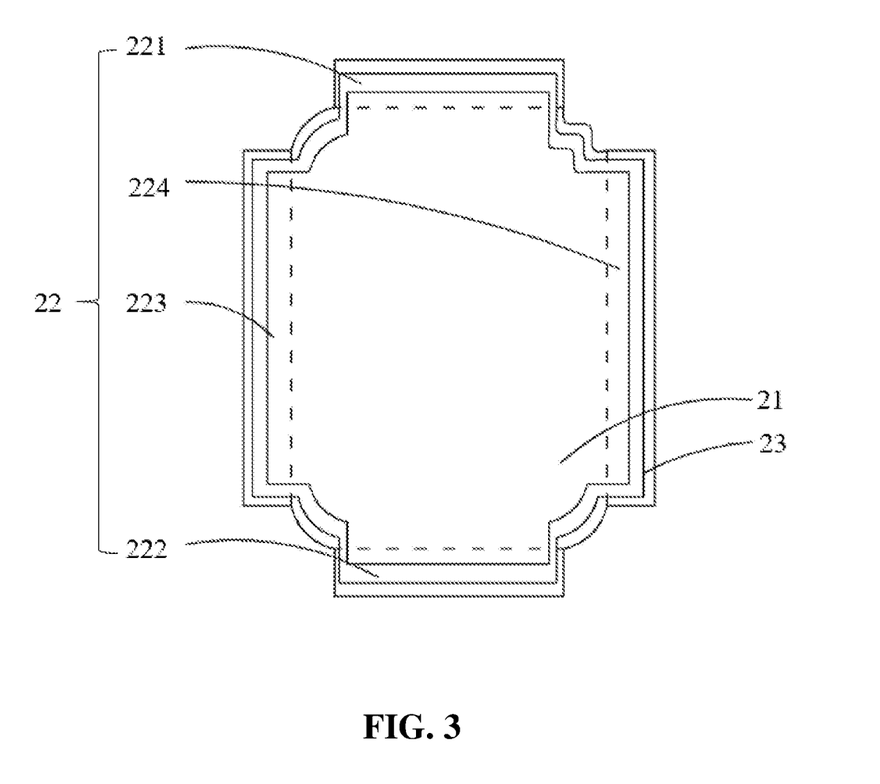
FIG. 3 is a plan view of a flexible display panel of a second embodiment of the present disclosure.

In this embodiment, the flexible display panel further includes metal wires 23 (the drawing only exemplarily shows the metal wires at an edge of the flexible display panel). In the edge area of the flexible display panel, the metal wires 23 are adaptively arranged along a shape of the edge area. Thus, by arranging the corner of the non-bending zone 22 to have the concave wave shape, the metal wires corresponding to the bending zone are correspondingly formed into a smooth curved shape. It can effectively release the stress there, reduce the risk of metal wires breaking, and thus improve a yield of the display panel.

Furthermore, the flexible display panel include a substrate, an array layer, an organic light emitting diode (OLED) device layer, and a thin film encapsulation layer.

The substrate is a flexible substrate, usually is made of a polyimide film.

The array layer is disposed on substrate.

The OLED device layer is disposed on the array layer.

The thin film encapsulation layer is disposed on the OLED device layer.

The array layer includes the metal wires. Usually, the metal wires in the edge area of the flexible display panel include a reset signal wire, a cathode potential wire, and wires configured to transmit test signals. The present disclosure does not specifically limit this.

It can be understood that, in the actual use process of the flexible display panel of the embodiment of the present disclosure, each bending zone respectively bends downward correspondingly to present a stereoscopic display performance.

Figure 4:
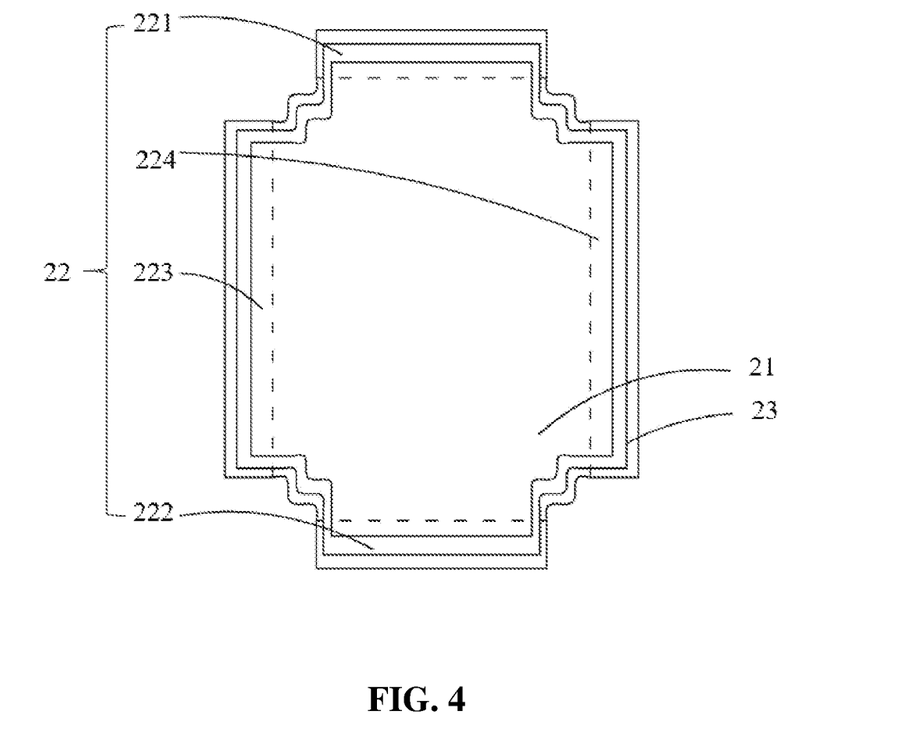
FIG. 4 is a plan view of a flexible display panel of a third embodiment of the present disclosure.

In order to reduce the risk of the metal wires breaking in the bending zone of the flexible display panel, based on the previous embodiment, another embodiment of the present disclosure provides a flexible display panel. Please refer to a plan view of FIG. 4, a flexible display panel also includes a non-bending zone 21 and a bending zone 22. A shape of the non-bending zone 21 is a first rectangle with rounded corners at all four corners. The bending zone 22 includes bending zones 221, 222, 223, and 224 disposed on upper, lower, left, and right sides of the non-bending zone 21. The difference is that each of the four corners of the non-bending zone 21 has a concave wave shape. Correspondingly, metal wires 23 in an edge area of the flexible display panel are adaptively arranged with the concave wave shape, that is, all corners are smooth and curved, thereby minimizing the risk of the metal wires 23 breaking due to bending stress.

Figure 5:
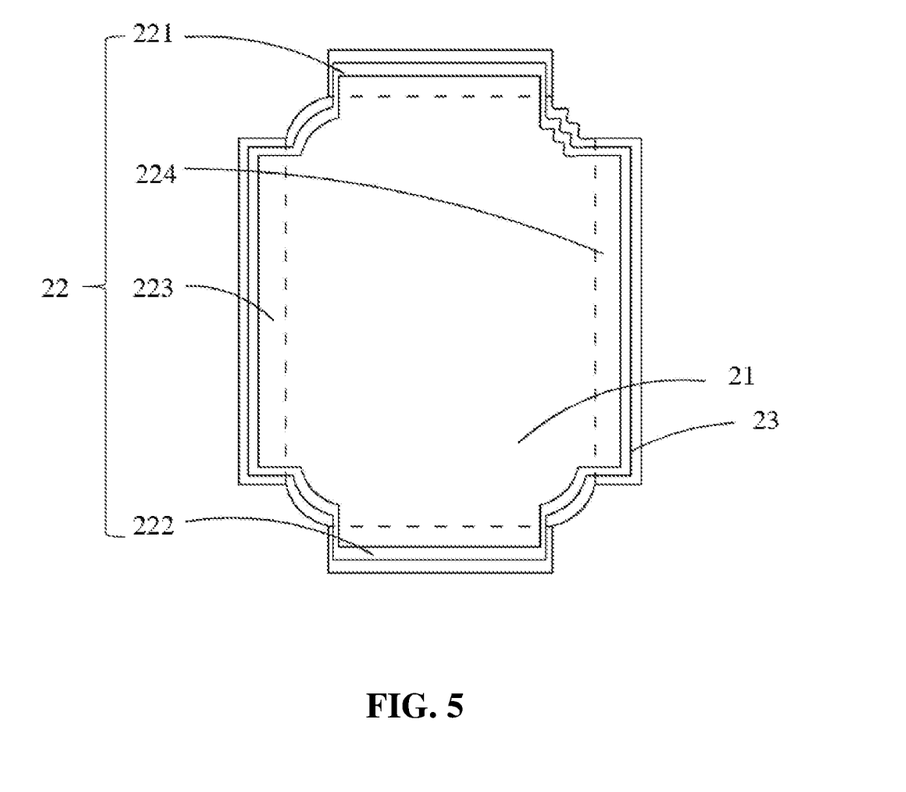
FIG. 5 is a plan view of a flexible display panel of a fourth embodiment of the present disclosure.

Please refer to a plan view of FIG. 5, another embodiment of the present disclosure also provides a flexible display panel. The flexible display panel also includes a non-bending zone 21 and a bending zone 22. A shape of the non-bending zone 21 is a first rectangle with rounded corners at all four corners. The bending zone 22 includes bending zones 221, 222, 223, and 224 disposed on upper, lower, left, and right sides of the non-bending zone 21. The rounded corner at the upper right of the non-bending zone 21 has a concave wave shape, and a curved direction of the concave wave shape is toward an inside of the non-bending zone 21. The difference is that the concave wave shape includes three crests (a direction protruding toward the non-bending zone 21 is defined as the crest) and two troughs. Two crests are set at the rounded corner corresponding to the bending zone, and the other crest is set between the two. By this design, the bending stress can be further released, thereby reducing the risk of the metal wires 23 breaking.

Apparently, the concave wave shape may have a greater number of crests and troughs, and according to actual design requirements, there are various distances between a plurality of crests and a plurality of troughs of the concave wave shape.

It should be added that, if the four corners of the non-bending zone all have the concave wave shape, the concave wave shapes of the four corners of the non-bending zone are the same or different from each other. For example, all four corners of the non-bending zone have a concave wave shape with two crests and a trough. Alternatively, two of the four corners of the non-bending zone have a concave wave shape with two crests and one trough, and the other two have another concave wave shape including three crests and two troughs. Other examples will not be repeated here.

Figure 6:
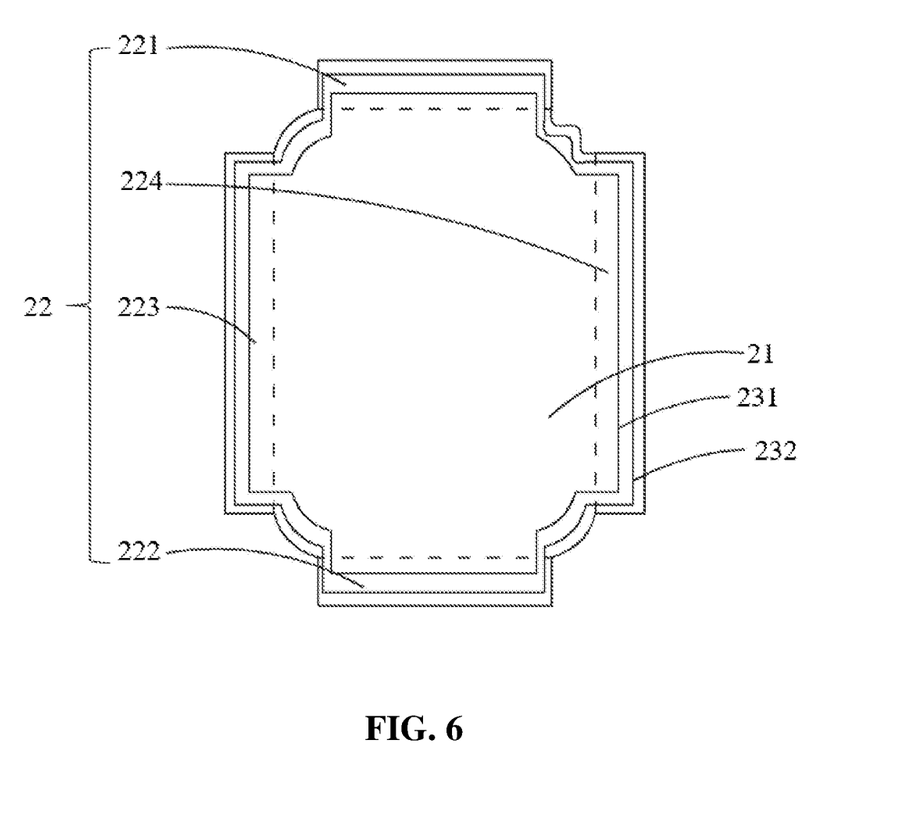
FIG. 6 is a plan view of a flexible display panel of a fifth embodiment of the present disclosure.

In the foregoing embodiments, the metal wires in the edge area of the flexible display panel are all adaptively arranged along the concave wave shape. Alternatively, part of the metal wires may be arranged adaptively along the concave wave shape, and part of the metal wires may be arranged along an original shape without modification. Specifically, please refer to FIG. 6, which is a plan view of a flexible display panel. A general structure of the flexible display panel has not been changed, only that a configuration of metal wires is slightly adjusted. A reset signal wire 232 is adaptively arranged along a concave wave shape, and a cathode potential wire 231 is arranged along an original shape without modification.

Figure 7:
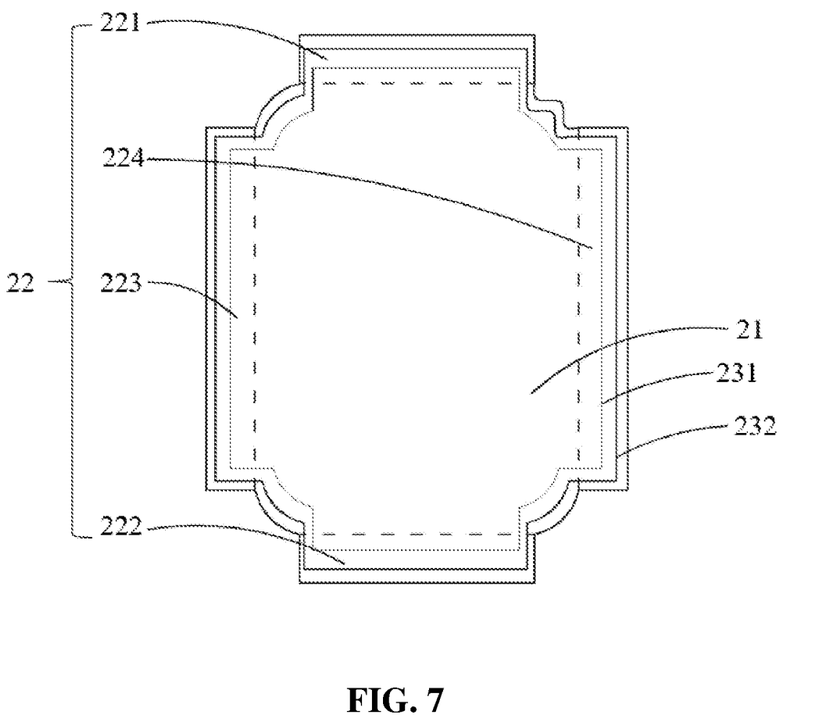
FIG. 7 is a plan view of a flexible display panel of a sixth embodiment of the present disclosure.

Furthermore, in order to reduce a risk of the above cathode potential wire 231 breaking in the bending zone, a width of the wire can be reduced (e.g., the width of the entire wire is reduced, or the width of the wire at the concave wave shape is reduced), so that a structure of FIG. 7 is formed. In this way, the risk of wire breakage of the cathode potential wire 231 that are not all adaptively arranged along the concave wave shape can be reduced to some extent.

Figure 8:
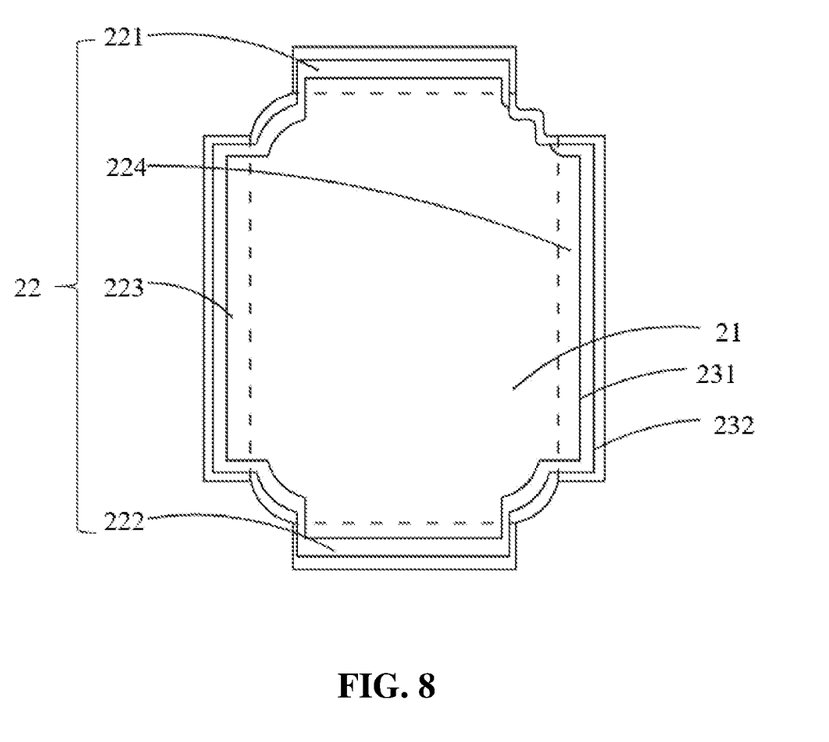
FIG. 8 is a plan view of a flexible display panel of a seventh embodiment of the present disclosure.

In another embodiment of the present disclosure, a flexible display panel is also provided, please refer to FIG. 8 for the specific structure. A general structure of the flexible display panel has not been changed, only that an arrangement of metal wires has been slightly adjusted. A reset signal wire 232 is adaptively arranged along the concave wave shape, and a cathode potential wire 231 is disconnected in an area of the concave wave shape. The cathode potential wire 231 is electrically connected to a concave wave wire of the reset signal wire 232 there. That is, the reset signal wire 232 and the cathode potential wire 231 realize a transmission of an electrical signal through a common concave wave wire.

The present disclosure also provides a display device including the flexible display panel mentioned above.

In the above embodiments, different emphasis is placed on respective embodiments, and reference may be made to related depictions in other embodiments for portions not detailed in a certain embodiment.

The flexible display panel and the display device provided in the embodiments of the present disclosure are described in detail above. The principle and the implementation manner of the present disclosure are described herein through specific examples in the specification. The description about the embodiments is merely provided to help understand the technical solutions and core ideas of the present disclosure. At the same time, for one of ordinary skill in the art, changes can be made to specific implementations and application scopes based on the ideas of the present disclosure. In summary, the content of the present specification should not be construed as limitations to the present disclosure.

What is claimed is:

1. A flexible display panel, comprising:
   a non-bending zone, wherein a shape of the non-bending zone is a first rectangle with rounded corners at all four corners; and
   at least one bending zone arranged around the non-bending zone and connected to the non-bending zone, wherein a shape of the at least one bending zone is a second rectangle, and a side of the second rectangle is connected to a straight side of the first rectangle with the rounded corners at all four corners, and wherein at least one of two rounded corners corresponding to the straight side of the non-bending zone connected to the at least one bending zone comprises a concave wave shape, and the concave wave shape comprises a plurality of crests and a plurality of troughs.

2. The flexible display panel as claimed in claim 1, wherein a curved direction of the concave wave shape is toward an inside of the non-bending zone.

3. The flexible display panel as claimed in claim 1, wherein a length of the side of the at least one bending zone connected to the non-bending zone is greater than a length of two sides adjacent to and perpendicular to the side.

4. The flexible display panel as claimed in claim 1, wherein there are various distances between the plurality of crests and the plurality of troughs of the concave wave shape.

5. The flexible display panel as claimed in claim 1, further comprising four bending zones correspondingly connected to four straight sides of the first rectangle with the rounded corners at all four corners of the non-bending zone, wherein at least one of the four corners of the non-bending zone comprises the concave wave shape, and a curved direction of the concave wave shape is toward an inside of the non-bending zone.

6. The flexible display panel as claimed in claim 5, wherein all four corners of the non-bending zone comprise the concave wave shape.

7. The flexible display panel as claimed in claim 5, wherein concave wave shapes of the four corners of the non-bending zone are the same or different from each other.

8. The flexible display panel as claimed in claim 1, further comprising a plurality of metal wires disposed at an edge area of the flexible display panel, wherein at least one of the metal wires is adaptively arranged along the concave wave shape in the edge area.

9. The flexible display panel as claimed in claim 8, further comprising:
   a substrate;
   an array layer disposed on the substrate;
   an organic light emitting diode (OLED) device layer disposed on the array layer; and
   a thin film encapsulation layer disposed on the OLED device layer,
   wherein the array layer comprises the plurality of metal wires, and the plurality of metal wires comprise a reset signal wire and a cathode potential wire.

10. A display device, comprising the flexible display panel as claimed in claim 1.

11. A flexible display panel, comprising:
   a non-bending zone, wherein a shape of the non-bending zone is a first rectangle with rounded corners at all four corners;
   at least one bending zone arranged around the non-bending zone and connected to the non-bending zone, wherein a shape of the at least one bending zone is a second rectangle, and a side of the second rectangle is connected to a straight side of the first rectangle with the rounded corners at all four corners, and wherein at least one of two rounded corners corresponding to the straight side of the non-bending zone connected to the at least one bending zone comprises a concave wave shape; and
   a plurality of metal wires disposed at an edge area of the flexible display panel, wherein at least one of the metal wires is adaptively arranged along the concave wave shape in the edge area, and wherein the at least one of the metal wires is adaptively arranged along the concave wave shape in the edge area, and remaining metal wires have a reduced width at the concave wave shape in the edge area.

* * * * *